United States Patent

Sahoda et al.

[11] Patent Number: 5,879,457
[45] Date of Patent: Mar. 9, 1999

[54] ROTATING CUP COATING DEVICE

[75] Inventors: Tsutomu Sahoda; Koji Ueda; Hiroki Endo; Hidenori Miyamoto, all of Kanagawa, Japan

[73] Assignee: Tokyo Ohka Kogyo Co., Ltd., Kanagawa, Japan

[21] Appl. No.: 783,988

[22] Filed: Jan. 14, 1997

[30] Foreign Application Priority Data

Jan. 16, 1996 [JP] Japan .................................. 8-004477

[51] Int. Cl.⁶ .............................. B05C 5/00; B05C 13/00
[52] U.S. Cl. ............................ 118/319; 118/501; 118/52; 118/320
[58] Field of Search ............................ 118/52, 320, 319, 118/500, 501; 269/21; 427/240, 430.1; 134/153; 156/345

[56] References Cited

U.S. PATENT DOCUMENTS

| | | | |
|---|---|---|---|
| 3,730,134 | 5/1973 | Kadi | 118/52 |
| 4,640,846 | 2/1987 | Kuo | 118/52 |
| 4,889,069 | 12/1989 | Kawakami | 118/52 |
| 5,042,421 | 8/1991 | Anbe | 118/52 |
| 5,415,691 | 5/1995 | Fujiyama | 118/52 |
| 5,439,519 | 8/1995 | Sago | 118/52 |

FOREIGN PATENT DOCUMENTS

| | | |
|---|---|---|
| 2531134 | 1/1976 | Germany . |
| 6170315 | 6/1994 | Japan . |
| 7132263 | 5/1995 | Japan . |

*Primary Examiner*—David A. Simmons
*Assistant Examiner*—Calvin Padgett
*Attorney, Agent, or Firm*—Carrier, Blackman & Associates, P.C.; Joseph P. Carrier; William D. Blackman

[57] ABSTRACT

A rotating cup type liquid coating device with structure for suppressing pulsatory movement of the coated liquid when stopping rotation of the inner cup 3, includes a buffer space S formed for connecting an inner space of the inner cup 3 and an inner space of an outer cup 2 surrounding the inner cup, on an outer periphery of the inner cup 3, through respective throttle portions 16, 17.

19 Claims, 2 Drawing Sheets

ROTATING CUP COATING DEVICE

BACKGROUND OF THE INVENTION

1. Field of the Invention

The present invention relates to a rotating cup coating device which is used to rotate a material to be treated after a coating liquid has been dropped onto the surface thereof for forming a coat of the liquid on the surface of the material to be treated such as a glass substrate or a semiconductor wafer or the like. Such coating device shall be referred to as a "rotating cup type liquid coating device" hereinbelow.

2. Description of the Relevant Art

There is already known a rotating cup type liquid coating device comprising an inner cup which is driven to rotate by a spinner, an outer cup disposed outside of the inner cup, and lid bodies, each of which selectively closes an open upper surface of the respective cup, as disclosed in Japanese Laid-Open Patent Publication No. 7-132263 (1995).

According to the known device, a penetrating hole is formed on the lid body for the inner cup and a valve is provided in a portion of the penetrating hole. Further, penetrating holes are also formed on lifting bodies for lifting up the lid bodies for the inner and outer cups. The function thereof is for preventing the dust floating around outside the cups from flowing into the inside of the cups when the lid bodies are opened, by decreasing the pressure difference between the inside of the inner cup and to the outside in advance of opening the lid bodies after the completion of a rotating and coating operation by the device. Particularly, the pressure is decreased through introducing gas (air) into the depressurized closed space defined between the inner cup and the lid body of the inner cup via the penetrating holes by opening the valve.

With the construction mentioned above, although it is possible to eliminate the disadvantage caused by the depressurization of the space defined between the inner cup and the lid body during the rotating and coating of the device, the device is undesirably more complicated in its construction because of forming of a special shape of the penetrating hole and a necessity of further provision of the valve.

SUMMARY OF THE INVENTION

In order to solve the above-mentioned depressurization problem with a device having a less complicated structure than the know device, according to the present invention, there is provided a rotating cup type liquid coating device, comprising: an inner cup for being driven to rotate by a spinner and for supporting thereon a substantially planar material to be treated; an outer cup disposed outside of said inner cup for receiving a drain from said inner cup; a lid body for the inner cup for covering upper surface of said inner cup; and a lid body for covering an upper surface of said outer cup, wherein a buffer space is defined in an outer periphery of said inner cup for connecting an inner space of said inner cup and an inner space of said outer cup.

Further, in the rotating cup type liquid coating device according to the present invention, it is preferable that said buffer space is connected with the inner space of said inner cup and the inner space of said outer cup through respective throttle portions.

DETAILED DESCRIPTION OF THE PREFERRED EMBODIMENT(S)

Hereinafter, an explanation will be given in more detail about the presently preferred embodiment according to the present invention, by referring to the accompanies drawings. Here, FIG. 1 is a cross-sectional view of the entire rotating cup type liquid coating device according to the present invention, and FIG. 2 an enlarged cross-sectional view of the essential portion of the same.

Figure 1:
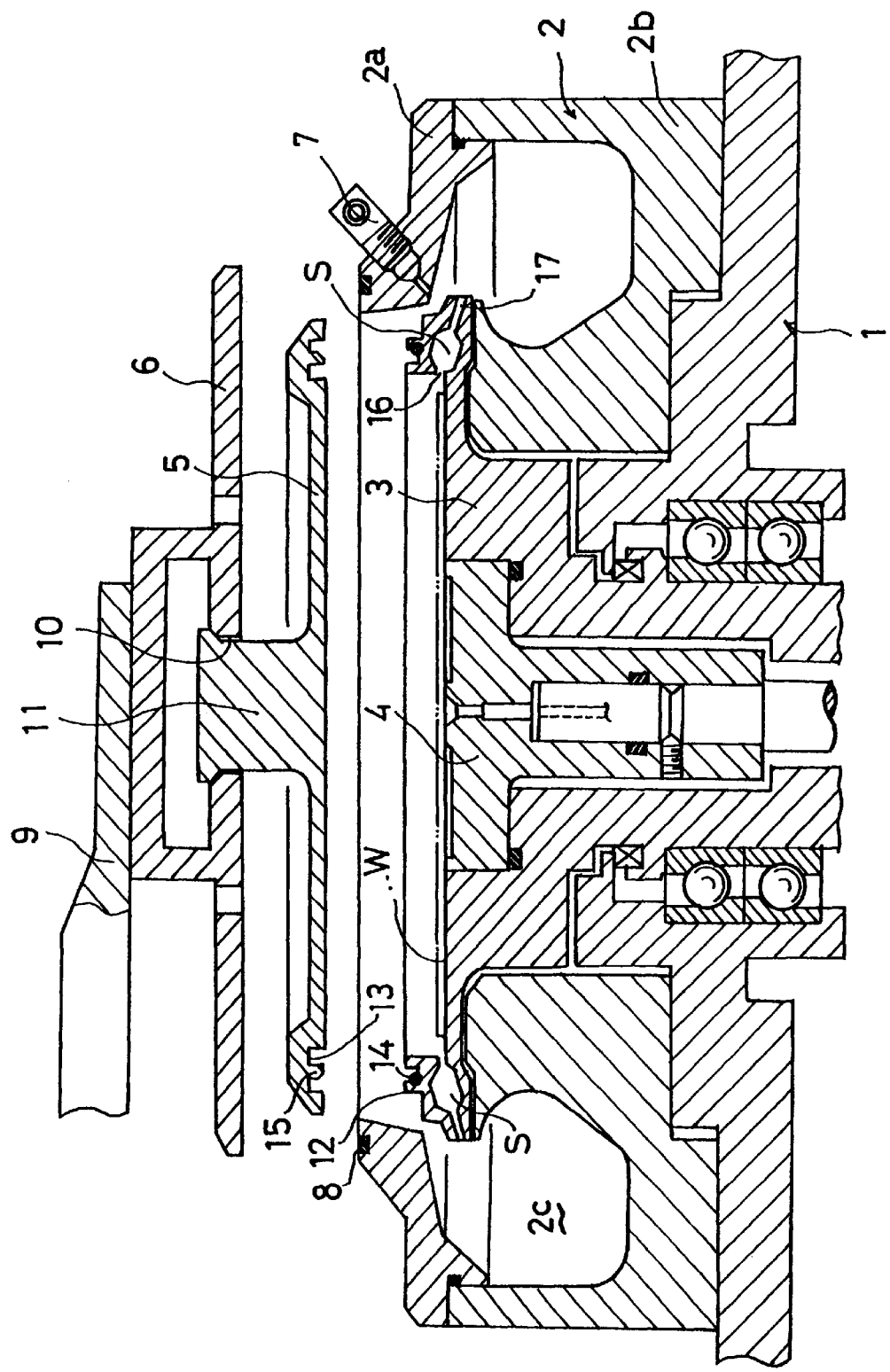
FIG. 1 is a cross-sectional view of a rotating cup type liquid coating device according to a presently preferred embodiment of the present invention.
Figure 2:
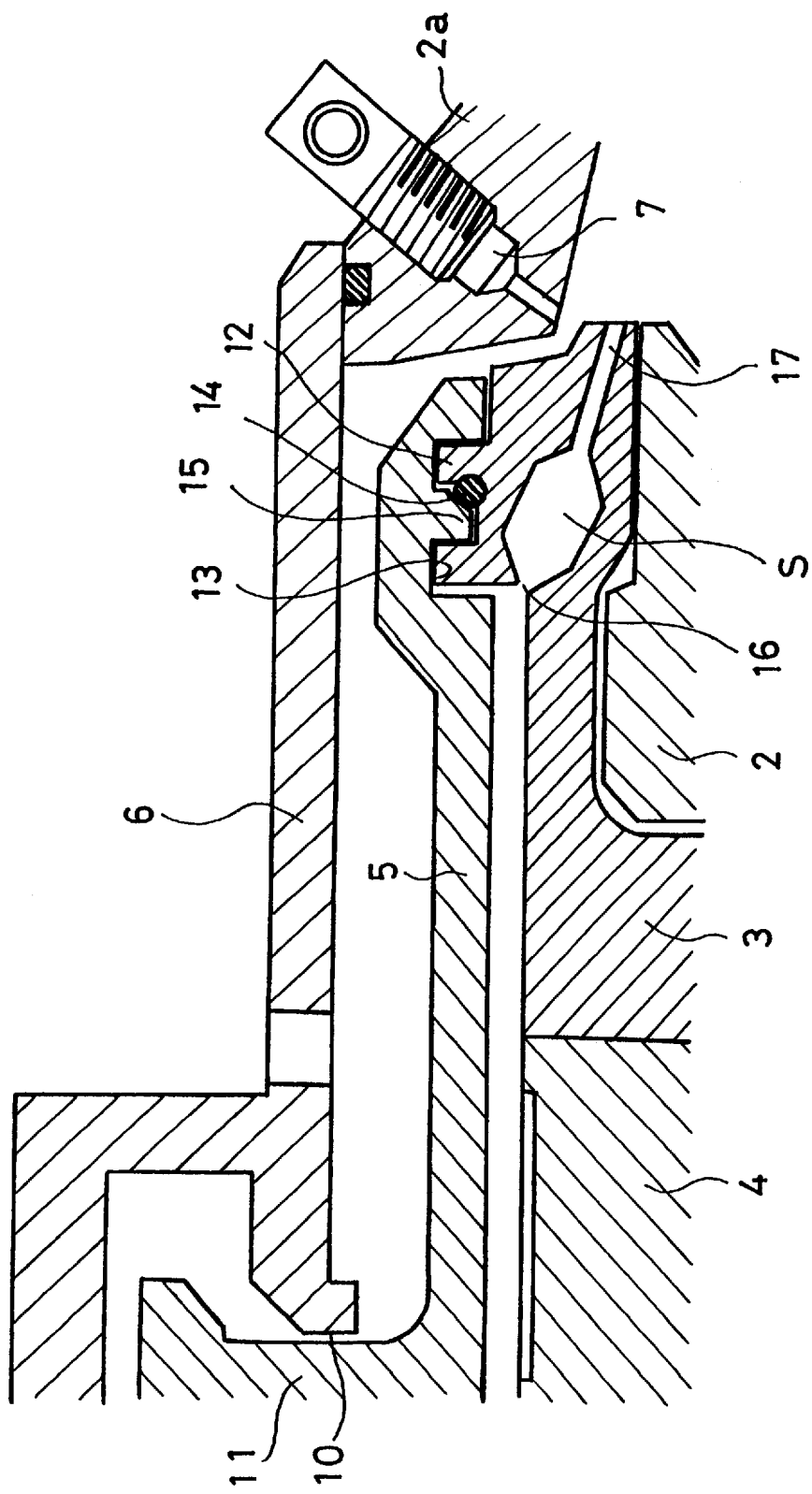
FIG. 2 an enlarged cross-sectional view of an essential portion of the same.

As shown in FIG. 1, the rotating cup type liquid coating device comprises a ring-shaped outer cup 2 which is fixed on a base 1, an inner cup 3 disposed within the outer cup 2, a chuck 4 provided at the center of the inner cup 3, and lid bodies 5 and 6 for covering the respective upper surfaces of the inner cup 3 and the outer cup 2.

The outer cup mentioned-above is made of an upper half body 2a and a lower half body 2b, and a ring-shaped liquid collecting passage 2c is formed by assembling those half bodies together. On the upper half body 2a is provided a nozzle 7 for injecting a washing liquid on the peripheral edge portion of the inner cup 3, and a O-shaped ring 8 is fitted onto the upper surface of the upper half body 2a.

The lid body 6 for the outer cup, closely contacting to the above mentioned O-shaped ring 8 under the condition of closing thereof, is fitted to an arm 9, and the lid body 5 for the inner cup is suspended at a boss portion 11 thereof and supported in an opening 10 formed at the center of the lid body 6 for the outer cup. Therefore, when the lid body 6 for the outer cup is moved up by lifting the arm 9 upward, the boss portion 11 of the lid body 5 for the inner cup is suspended at the upper edge portion thereof in the opening 10, then the lid body 5 for the inner cup is also moved up. On the contrary, when the arm 9 goes down, first the lid body 5 for the inner cup closes the upper surface of the inner cup 3, and then the arm 9 moves further down with the lid body 6 for the outer cup so as to close the upper surface of the outer cup 2.

A convex-and-concave portion 12 is formed on an upper surface of the periphery of the inner cup 3, and a convex-and-concave portion 13 corresponding thereto is formed on an lower surface of the periphery of the lid body 5 for inner cup. Further, an O-shaped ring 14 is provided in the concave area of the convex-and-concave portion 12, and the convex part 15 at the center of convex-and-concave portion 13 has a tapered surface, so that it is always possible to keep good sealing stickiness by pressing the tapered surface to the O-shaped ring 14 even though it is worn a little bit.

Further, a buffer space S is formed on an outer peripheral portion of the above inner cup 3, which provides communication between the respective inner spaces of the inner cup and the outer cup. The buffer space S has a constant cross-sectional area and a ring-like shape, and it is connected at one side thereof to the inner space of the inner cup, i.e., a space for performing a coating operation through a throttle body 16, and is connected to another side thereof to the inner space of the outer cup, i.e., the liquid collecting passage 2c, through another throttle body 17.

In the above-mentioned construction, the material W to be treated, such as the glass substrate or the semiconductor wafer and soon, is set on the chuck 4 after lifting the arm 9 and opening the upper surfaces of the outer cup 2 and the inner cup 3. Under this condition, the coating liquid is dropped from a nozzle not shown in this drawing at the center of the surface of the material W to be treated, and the arm 9 is descended. After covering cups 32 by the lid bodies 5, 6, the chuck 4 and the inner cup are driven to rotate as a unit, thereby spreading and coating the coating liquid uniformly on the surface of the material W by the centrifugal force.

At the time of rotating the inner cup, the air within the space defined by the inner cup 3 and the lid body 5 is discharged through the buffer space S out of the inner cup 3 by the centrifugal force, therefore the pressure is decreased in the space defined by the inner cup 3 and the lid body 5.

After finishing coating of the coating liquid on the surface of the material W in such manner as mentioned in the above, the inner cup 3 stops the rotation thereof. Then, since the space defined by the inner cup 3 and the lid body 5 is in the depressurized condition, whereas no further centrifugal force is generated, the air flows into the inner space of the inner cup 3 through the buffer space S from the outside.

At that time, since there are formed the throttle bodies 1.6, 17 between the buffer space S and the inner spaces of the inner cup 3 and the outer cup 2, respectively, no turbulence occurs within the inner space of the inner cup 3, and the pressure within the inner cup 3 increases, thereby prohibiting the coating liquid (coating film) from being pulsatorily swelled in a wave-like shape or the like on the surface of the material W.

As fully described in the above, according to the present invention, since in the rotating cup type liquid coating device, the buffer space is formed in the periphery of the inner cup for connecting the inner space of the inner cup and the inner space of the outer cup through the throttle bodies, the air outside of the inner cup will not turn back directly into the inside of the inner cup when the inner cup stops rotating, but turns back indirectly only after it is first introduced into the buffer spaces. Therefore, it is possible to prevent the dust from flowing into the inside of the inner cup with a simple construction, and furthermore to remove the unfavorable effect on the coating surface of the material W which might otherwise be caused due to the pulsatory movement of the coated liquid on the material.

Although there has been described what is considered to be the presently preferred embodiment of the invention, it will be understood by persons skilled in the art that variations and modifications may be made thereto without departing from the spirit or essence of the invention. The scope of the invention is indicated by the appended claims rather than by the foregoing description of the presently preferred embodiment.

What is claimed is:

1. A rotating cup coating device, comprising:
   an inner cup for being driven to rotate by a spinner and for supporting thereon a substantially planar material to be treated;
   an outer cup disposed outside of the inner cup for receiving a drain from said inner cup;
   a first lid body for covering an upper surface of said inner cup; and
   a second lid body for covering an upper surface of said outer cup, wherein:
   a buffer space is defined in an outer periphery of said inner cup for connecting an inner space of said inner cup and an inner space of said outer cup.

2. A rotating cup coating device as claimed in claim 1, wherein said buffer space is connected to the inner space of said inner cup and the inner space of said outer cup through respective throttle portions also defined in the outer periphery of said inner cup.

3. A rotating cup coating device according to claim 2, wherein said buffer space has a larger cross-sectional area than cross-sectional areas of said throttle portions.

4. A rotating cup coating device according to claim 2, wherein said buffer space and said throttle portions define a continuously open communication path which allows a substantially turbulence-free flow of air from the inner space of the outer cup to the inner space of the inner cup after a coating operation.

5. A rotating cup coating device as defined in claim 1, wherein said inner space of said outer cup is defined in a drain collecting passage at a periphery of the outer cup.

6. A rotating cup coating device as claimed in claim 1, wherein said inner space of said inner cup is a space for performing a coating operation on the substantially planar material.

7. A rotating cup coating device as claimed in claim 1, wherein said buffer space is ring shaped and extends around the outer periphery of said inner cup.

8. A rotating cup coating device as claimed in claim 7 wherein said buffer space has a constant cross-sectional area.

9. A rotating cup coating device as claimed in claim 1, wherein the outer periphery of said inner cup and an outer periphery of the first lid body have mating convex-and-concave portions defined therein which operatively engage each other when the first lid body covers the upper surface of the inner cup.

10. A rotating cup coating device as claimed in claim 9, further including a sealing member disposed with one of said convex-and-concave portions for being sealingly engaged therebetween when the first lid body covers the upper surface of said inner cup.

11. A rotating cup coating device as claimed in claim 10, wherein the other of said convex-and-concave portions has a convex part with a tapered surface that engages said sealing member when the first lid body covers the upper surface of said inner cup.

12. A rotating cup coating device according to claim 1, wherein said buffer space defines a continuously open communication path which channels said drain from said inner cup to said inner space of said outer cup during a coating operation of the coating device and which allows a buffered flow of air from the inner space of the outer cup to the inner space of the inner cup after the coating operation.

13. A rotating cup coating device, comprising:
    an inner cup for being driven to rotate by a spinner and for supporting thereon a substantially planar material to be treated;
    an outer cup disposed outside of the inner cup for receiving a drain from said inner cup;
    lid means for selectively covering upper surfaces of said inner cup and said outer cup; and
    buffer means defined in an outer peripheral portion of said inner cup for providing a buffered communication path between an inner space of said inner cup and an inner space of said outer cup to reduce pressure differences between the inner spaces of said inner and outer cups.

14. A rotating cup coating device as claimed in claim 13, wherein said buffered communication path includes a buffer space defined within the outer peripheral portion of said inner cup.

15. A rotating cup coating device as claimed in claim 14, wherein said buffered communication path further includes throttle portions defined in the outer peripheral portion of said inner cup for respectively connecting said buffer space with the inner space of said inner cup and the inner space of said outer cup.

16. A rotating cup coating device as claimed in claim 15, wherein said buffer space has a larger cross-sectional area than cross-sectional areas of said throttle portions.

17. A rotating cup coating device as claimed in claim 14, wherein said buffer space is ring shaped and extends around the outer peripheral portion of said inner cup.

18. A rotating cup coating device according to claim 13, wherein said buffered communication path is continuously open so that it functions automatically to reduce the pressure differences between the inner spaces of said inner and outer cups after a coating operation.

19. A rotating cup coating device according to claim 13, wherein said buffered communication path allows a substantially turbulence-free flow of air from said inner space of said outer cup to said inner space of said inner cup after a coating operation.

\* \* \* \* \*

UNITED STATES PATENT AND TRADEMARK OFFICE
CERTIFICATE OF CORRECTION

PATENT NO : 5,879,457
DATED : 09 March 1999
INVENTOR(S): Tsutomu Sahoda, Koji Ueda, Hiroki Endo, Hidenori Miyamoto It is certified that error appears in the above-identified patent and that said Letters Patent is hereby corrected as shown below:

Column 1, line 28, change "and to the" to --and the--;
    line numbered between 46 and 47, change "know" to --known--.
Column 2, line 1, after "FIG. 2" insert --is--;
    line 8, change "accompanies" to --accompanying--;
    line 11, after "FIG. 2" insert --is--;
    line numbered between 19 and 20, change "mentioned-above" to --mentioned above--;
    line numbered between 24 and 25, change "a 0-shaped" to --an 0-shaped--;
    line numbered between 27 and 28, change "above mentioned" to --above-mentioned--;
    line 45, before "lower" delete --an--;
    line 58, after "operation" insert a comma;
    line 64, change "soon" to --so on--.
Column 3, line 2, change "32" to --3, 2--;
    line numbered between 19 and 20, change "1.6" to --16--;
    line numbered between 35 and 36, change "spaces" to --space S--.
Column 4, line numbered between 19 and 20 (claim 7, line 2), change "ring shaped" to --ring-shaped--;
    line numbered between 21 and 22 (claim 8, line 1), after "7" insert a comma.
Column 5, line 7 (claim 17, line 2), change "ring shaped" to --ring-shaped--.

Signed and Sealed this

Seventh Day of September, 1999

*Attest:*

Q. TODD DICKINSON

*Attesting Officer*    *Acting Commissioner of Patents and Trademarks*